United States Patent
LaBerge (12)

(10) Patent No.: US 6,880,094 B2
(45) Date of Patent: Apr. 12, 2005

(54) CAS LATENCY SELECT UTILIZING MULTILEVEL SIGNALING

(75) Inventor: Paul A. LaBerge, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 587 days.

(21) Appl. No.: 10/047,324

(22) Filed: Jan. 14, 2002

(65) Prior Publication Data

US 2003/0133331 A1 Jul. 17, 2003

(51) Int. Cl.[7] .................................................. G06F 1/26
(52) U.S. Cl. ...................... 713/300; 713/320; 713/323; 713/324; 713/340; 713/600; 365/189.02; 365/189.09; 365/230.02; 365/230.03; 365/233; 365/193; 711/105; 711/170
(58) Field of Search .................................. 713/300, 320, 713/323, 324, 340, 600; 365/189.02, 189.09, 230.02, 230.03, 233, 193; 711/105, 170

(56) References Cited

U.S. PATENT DOCUMENTS

| | | | | | |
|---|---|---|---|---|---|
| 5,278,974 | A | * | 1/1994 | Lemmon et al. | ............ 713/600 |
| 6,101,149 | A | * | 8/2000 | Park et al. | ............. 365/230.06 |
| 6,338,113 | B1 | * | 1/2002 | Kubo et al. | ................. 711/105 |

* cited by examiner

*Primary Examiner*—A. Elamin
*Assistant Examiner*—Nitin C. Patel
(74) *Attorney, Agent, or Firm*—Fletcher Yoder

(57) ABSTRACT

A method of selecting CAS latencies in a system. Specifically, a system which includes a plurality of memory modules is provided. Because different memory modules may have different CAS latencies, multilevel signaling is used to standardize the CAS latencies throughout the system. A static pin is provided on each memory device such that a drive signal can be received. The voltage level of the drive signal corresponds to a selected CAS latency for the system.

26 Claims, 3 Drawing Sheets

CAS LATENCY SELECT UTILIZING MULTILEVEL SIGNALING

BACKGROUND OF THE INVENTION

1. Field of the Invention

The present invention relates generally to memory subsystems and, more specifically, to a technique for selecting CAS latency in a memory device.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In today's complex computer systems, speed, flexibility, and reliability in timing and control are issues typically considered by design engineers tasked with meeting customer requirements while implementing innovations which are constantly being developed for computer systems and their components. Computer systems typically include a plurality of memory devices which may be used to store programs and data and may be accessible to other system components such as processors or peripheral devices. Each memory device has an associated latency period corresponding to an interval between the time that the memory device receives an access request and the time it delivers the requested data. This time interval between request receipt and data delivery is referred to as the "CAS latency." Because different memory devices are designed with different CAS latencies, a memory controller may be tasked with coordinating the exchange of requests and data in the system between requesting devices and the memory device such that timing parameters, such as CAS latency, are considered to ensure that requests and data are not corrupted by overlapping requests and information.

Typically, memory devices are grouped together to form memory modules such as dual-inline memory modules (DIMM). Computer systems may incorporate numerous modules to increase the storage capacity of the system. Because CAS latency on the memory devices contained on each memory module may differ from one module to another, each memory module is generally checked at boot-up such that the various module and device specific parameters, such as CAS latency, may be conveyed to the memory controller. Thus, each memory module may include a device to convey information, such as size, speed, and voltage, to the memory controller. One such device is a serial presence detect (SPD) which makes it easier for the system BIOS to properly configure the system to fit the particular performance profiles of the devices on the corresponding memory module. An SPD device is typically an eight-pin serial chip which stores information about the memory module including but not limited to the module size, speed, voltage, drive strength, and the number of row and column addresses. At boot-up, the BIOS reads these parameters and automatically adjusts values in its chipset to maximize reliability and system performance.

To provide design flexibility, memory devices are often configured such that certain parameters, such as CAS latency, may be selected at boot-up. In systems incorporating numerous memory modules, it may be advantageous to adjust the CAS latencies in each of the devices such that they are the same for each device rather than providing devices which may operate at different speeds due to varying CAS latency selection. By selecting a single CAS latency to be applied to each of the devices throughout the system, the memory controller design may be simplified and conflicts may be easier to manage. For example, in a given system, a user may insert two different memory modules, where memory module may be capable of better (i.e., lower) CAS latency. It may be desirable to program the better performing memory module to react with the same CAS latency as the slower memory module to simplify controller design.

One mechanism for facilitating the selection of CAS latency in a system involves using mode registers. At boot-up, the memory controller reads the SPD device on each memory module. After determining the current system configuration and the slowest memory module, a mode register in each memory module is written with the desired CAS latency (here the CAS latency of the slowest module in the present system). However, implementing mode registers for each memory device may disadvantageously utilize extra space on each memory device.

Another mechanism for selecting CAS latency involves using static pins on each memory device. As with the prior technique, the memory controller reads the SPD device on each memory module to check the current configuration. Once the memory controller determines the desirable CAS latency, the memory controller may instruct the SPD device or command address buffer to drive static pins on each of the memory devices. However, this method may require numerous static pins on each memory device to support the numerous CAS latencies which may be possible. Disadvantageously, this technique may also necessitate the use of valuable real estate on each memory device.

The present invention may address one or more of the concerns set forth above.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
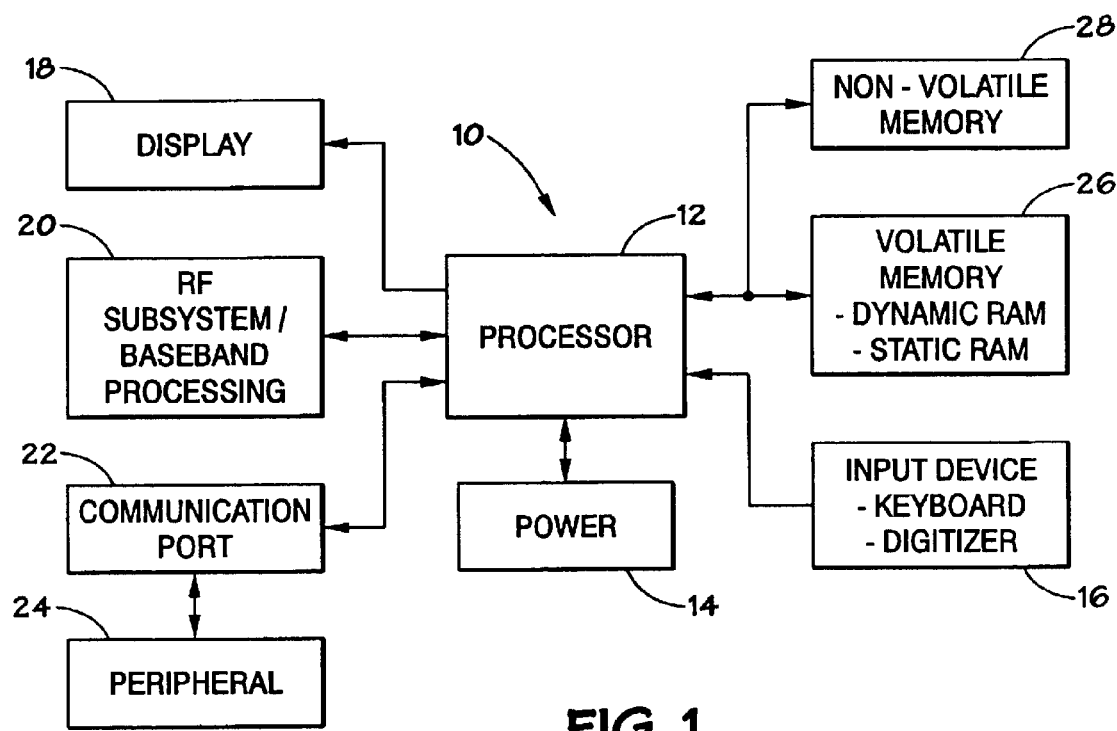
FIG. 1 illustrates a block diagram of an exemplary processor-based device.

Turning now to the drawings, and referring initially to FIG. 1, a block diagram depicting an exemplary processor-based system, generally designated by reference numeral 10, is illustrated. The system 10 may be any of a variety of types such as a computer, pager, cellular phone, personal organizer, control circuit, etc. In a typical processor-based device, a processor 12, such as a microprocessor, controls the processing of system functions and requests in the system 10. Further, the processor 12 may comprise a plurality of processors which share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance. Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF sub-system/baseband processor 20 may also be couple to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs. Generally, the memory is coupled to the processor 12 to store and facilitate execution of various programs. For instance, the processor 12 may be coupled to the volatile memory 26 which may include Dynamic Random Access Memory (DRAM) and/or Static Random Access Memory (SRAM). The processor 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. The volatile memory 26 on the other hand, is typically quite large so that it can store dynamically loaded applications and data. Additionally, the non-volatile memory 28 may include a high capacity memory such as a tape or disk drive memory.

Figure 2:
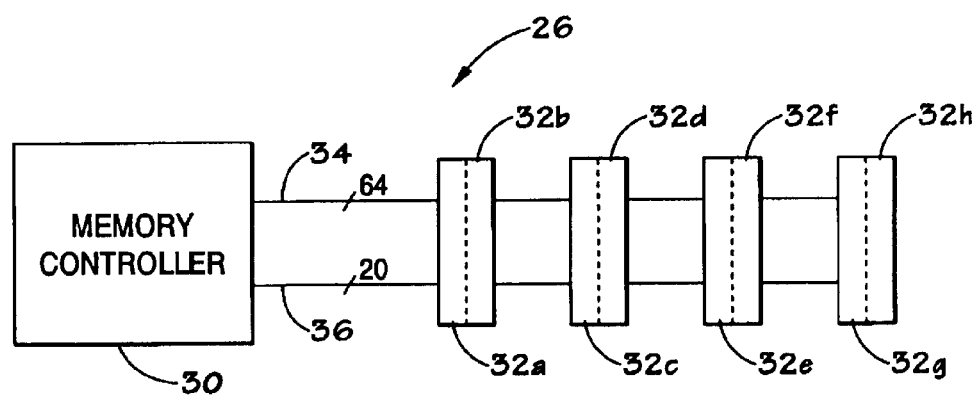
FIG. 2 illustrates an exemplary memory sub-system in accordance with the present techniques.

FIG. 2 generally illustrates a block diagram of a portion of a memory sub-system, such as the volatile memory 26. A memory controller 30 is generally provided to facilitate access to the storage devices. While the present embodiment illustrates the memory controller 30 as existing in the memory sub-system, the memory controller 30 may be in the processor 12 or may exist in a completely separate chip, as can be appreciated by those skilled in the art. The memory controller 30 may receive requests to access the memory devices via one or more processors, such as the processor 12, via peripheral devices, such as the peripheral device 24, and/or via any other systems. As previously discussed, the memory controller 30 is generally tasked with facilitating the execution of the requests to the memory devices and coordinating the exchange of information, including configuration information, to and from the memory devices. The memory sub-system may include a plurality of slots or ranks 32A–32H which are configured to operably couple a memory module, such as a dual-inline memory module (DIMM), to the memory controller 30 via one or more memory buses. Each DIMM generally includes a plurality of memory devices such as dynamic random access memory (DRAM) devices capable of storing data. The memory buses may include a memory data bus 34 to facilitate the exchange of data between each memory device and the memory controller 30. The memory data bus 34 actually comprises a plurality of single bit data buses each coupled from the memory controller 30 to an individual memory device. In one embodiment of the volatile memory 26, the memory data bus 34 may include 64 individual data buses. In this embodiment, each of the eight memory ranks 32A–32H is capable of supporting a module comprising eight individual memory devices. Further, the memory data bus 34 may include one or more individual buses to each memory rank 32A–32H which may be used for ECC error detection and correction. As can be appreciated by those skilled in the art, the individual buses in the memory data bus 34 will vary depending on the configuration and capabilities of the system 10.

The volatile memory 26 also includes a command bus 36 on which address information such as command address (CA), row address select (RAS), column address select (CAS), write enable (WE), bank address (BA), and chip select (CS), for example, may be delivered for a corresponding request. Further, the command bus 36 may also be used to facilitate the exchange of configuration information at boot-up, as previously discussed. As with the memory data bus 34, the command bus 36 may actually comprise a plurality of individual command buses. A single command bus may be provided for each corresponding memory device on each corresponding memory module. In the present embodiment, the command bus may include 20 individual buses. Further, the command bus 36 may include an error detection and correction (ECC) bus for each memory rank 32A–32H. As previously explained with reference to the memory data bus 34, a variety of embodiments may be implemented for the command bus 36 depending on the system configuration.

Figure 3:
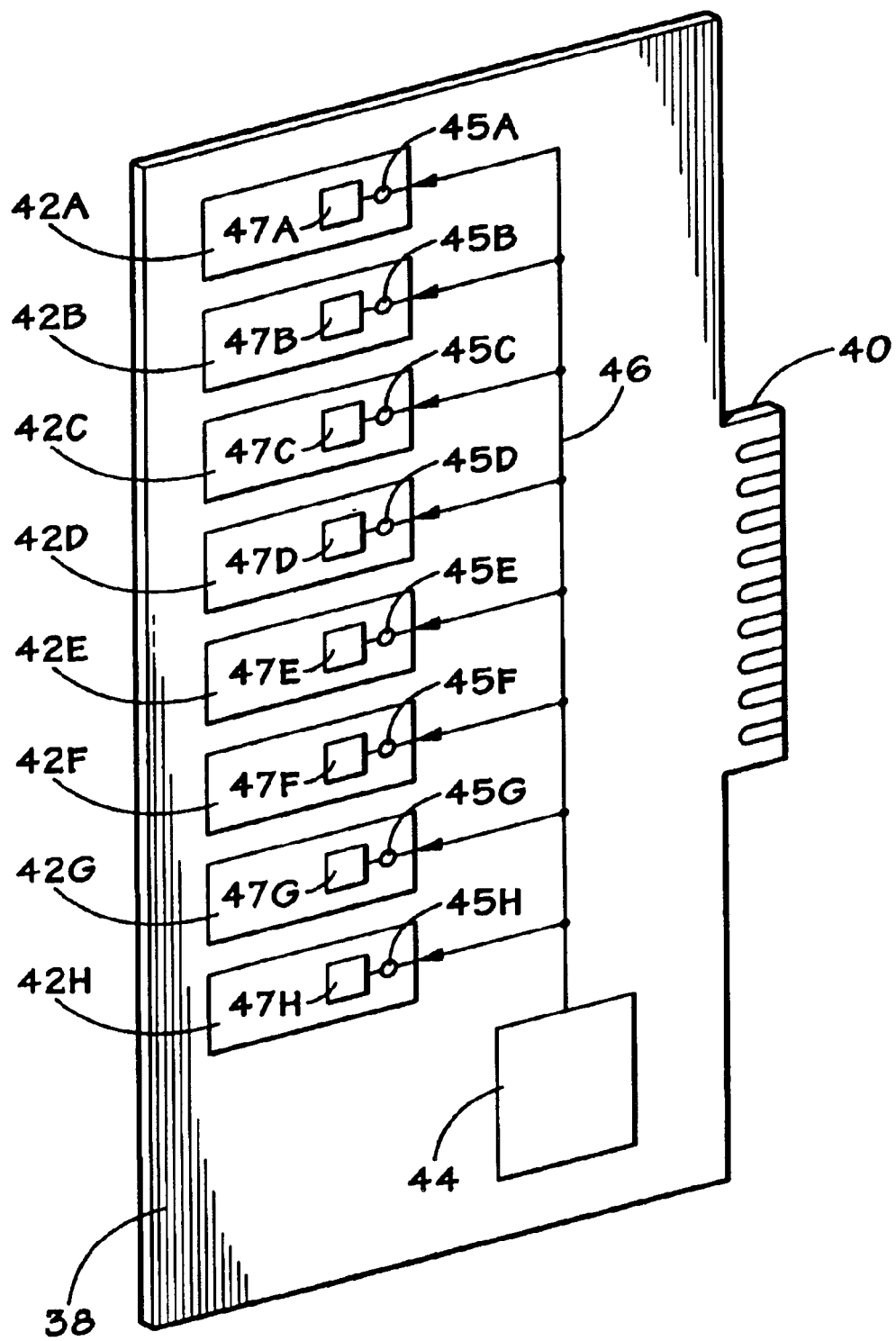
FIG. 3 illustrates an exemplary memory module in accordance with the present techniques.

FIG. 3 illustrates an exemplary memory module 38 that may be inserted in one of the memory ranks 32A–32H. The memory module 38 may include an edge connector 40 to facilitate mechanical coupling of the memory module 38 into a memory rank 32A–32H. Further, the edge connector 40 provides a mechanism for facilitating the exchange of data and control signals from the memory controller 30 to devices on the memory module 38. As previously discussed, the memory module 38 may include a plurality of memory devices 42A–42H, such as synchronous dynamic random access devices (SDRAMs), which may be used for storing information. Further, the memory module 38 may include a device, such as a serial presence detect (SPD) device 44, which may be used to store configuration information, such as storage capacity and timing requirements, for each memory device 42A–42H on the memory module 38.

Each memory device 42A–42H may facilitate a programmable CAS latency. As previously discussed, the present system may facilitate the use of multiple memory modules, each incorporating memory devices with different potential CAS latencies with respect to other memory modules. To simplify system control, it may be advantageous to program each memory device in the system with the same CAS latency. In one technique, the SPD device 44 may be used to drive static pins on each memory device 42A–42H such that the CAS latency may be selected. The CAS latency is selected by the memory controller 30, based on the current system configuration. However, the traditional method implements increased numbers of pins if the memory device 42A–42H provides for additional CAS latencies. As can be understood considering the binary combinations, a single pin facilitates up to two CAS latencies, two pins facilitate up to four CAS latencies, three pins facilitate up to eight CAS latencies, and so forth. Disadvantageously, increasing the number of pins on each memory device 42A–42H increases the use of precious die space, as well as increasing the routing and signal paths on the memory module 38 to accommodate the number of pins on each memory device 42A–42H.

One technique for implementing memory devices with programmable CAS latencies, without increasing the number of static pins on each device, is to utilize multilevel signaling. Multilevel signaling is generally undesirable in dynamic switching because the noise margins may provide false trigger values. However, here, the multilevel signal is used to statically select a CAS latency. The signal is simply toggled once (e.g. at boot-up). Once a CAS latency is selected for the entire system, the memory controller 30 (generally driven by the system BIOS), directs the SPD device 44 on each memory module 38 to convey the appropriate signal value to each memory device 42A–42H. The SPD device 44 is programmed with a table of CAS latencies and corresponding voltage levels. Once the appropriate CAS latency is received by the SPD device 44, the SPD device 44 drives a single pin 45A–45H on each memory device 42A–42H with a corresponding voltage level via a drive path 46. Each memory device 42A–42H includes a sensing device 47A–47H, such as a multi-level input sensing buffer for example, coupled to the static pin 45A–45H such that it may interpret the CAS latency from the voltage signal received on the drive path 46.

Figure 4:
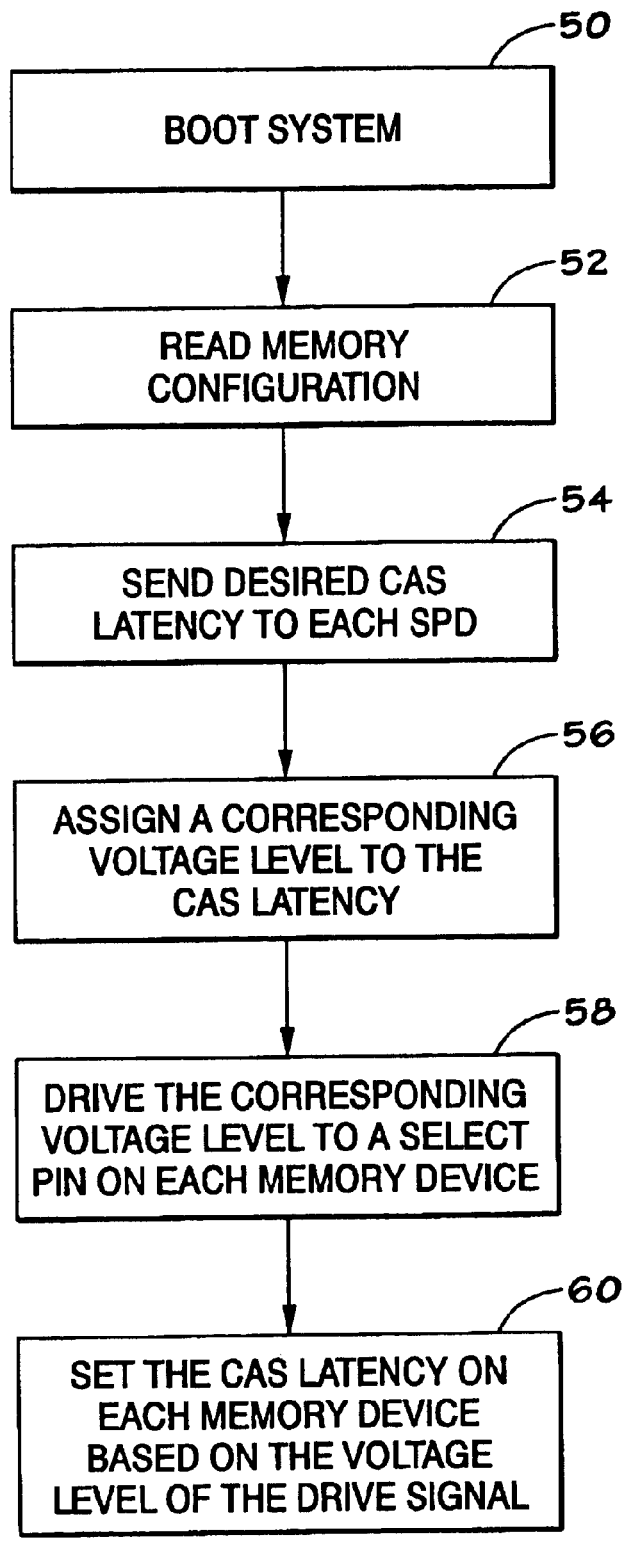
FIG. 4 is a flow chart illustrating an exemplary method for selecting CAS latency in accordance with the present techniques.

FIG. 4 illustrates an exemplary technique for incorporating multilevel signaling to select the CAS latency in a computer system. Initially, the computer system is powered on at system boot-up, as indicated in block 50. At boot-up, the system BIOS generally checks the current system configuration, including the memory configuration, as indicated by block 52. The BIOS may read a device on each memory module, such as an SPD device, which includes configuration registers describing what devices and device parameters exist on the corresponding memory module. Once the memory configuration is determined, the system BIOS will normally determine the fastest possible CAS latency based on the current memory configuration. The BIOS will normally determine the fastest CAS latency at which all of the devices currently incorporated into the system may be run. The BIOS then sends the selected CAS latency to each of the SPDs on each of the memory modules, as indicated by block 54. Each SPD is programmed with a table of CAS latencies. Each CAS latency has a corresponding voltage level. Table 1 illustrates an exemplary table that may be stored in each SPD.

TABLE 1

| CAS LATENCY | VOLTAGE LEVEL |
|---|---|
| 1.0 | −0.5 v through −0.3 v |
| 1.5 | −0.1 v through +0.1 v |
| 2.0 | +0.3 v through +0.5 v |
| 2.5 | +0.7 v through +0.9 v |
| 3.0 | +1.1 v through +1.3 v |
| 3.5 | +1.5 v through +1.7 v |
| 4.0 | +1.9 v through +2.1 v |

As indicated in Table 1, each possible CAS latency has a corresponding voltage range. To avoid misinterpretation of the voltage value due to noise margin, a voltage gap may be provided between each range. In the present illustration, if the SPD receives a signal indicating that the CAS latency should be 2.0, a voltage signal in the range of 0.3 v to 0.5 v will be assigned, as indicated in block 56. Next, a signal is generated by the SPD to the select pin on each memory device on the corresponding memory module, as indicated in block 58. The signal will correspond to the assigned voltage. Each memory device includes a sensing device, such as a multi-level input sensing buffer, which is able to receive the drive signal from the SPD and translate it to the corresponding CAS latency, as indicated in block 60. The voltage signal may be translated to the corresponding CAS latency by an analog to digital converter, for example. Alternately, each memory device may include a buffer for storing a table which corresponds to the table stored in the SPD device. When the multi-level voltage signal is received by the pin on the memory device, the sensing device senses the voltage and accesses the table to obtain the corresponding CAS latency.

As can be appreciated by those skilled in the art, different voltage levels may be used to correspond to the various CAS latencies which may be implemented in the system. Each SPD device may be programmed with a voltage range corresponding to any CAS latencies which may be implemented by any of the memory devices which may be incorporated into the system.

Further, the exemplary embodiment illustrates a system wherein the SPD device used to store configuration information for the corresponding memory module is also used to drive the multi-level voltage signal to the static pin on each memory device. Alternately, a different device on the memory module, such as the command/address buffer may be used to drive the multi-level voltage signal. Thus, it in not necessary for the same device that is used to store the configuration information to be used to drive the multi-level voltage signal.

Still further, while the present embodiment illustrates setting a single CAS latency for the entire system at boot-up and under control of the system BIOS, the system CAS latency may be reset after an event, such as a hot-plug event or a user initiated reset. In this instance, the CAS latency may be reset without powering down the system. The determination and assignment of the best possible system CAS latency may be performed by a host controller in the processor.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory module comprising:
    a detection device configured to produce an output signal having one of at least three voltage levels correlative to at least three respective selectable CAS latencies; and
    a plurality of memory devices coupled to the detection device, wherein each of the plurality of memory devices comprises a single pin configured to receive the output signal and configured to set the CAS latency of the respective memory device correlative to the voltage levels of the output signal.

2. The memory module, as set forth in claim 1, wherein the detection device comprises a serial presence detect (SPD) device.

3. The memory module, as set forth in claim 1, wherein the memory module comprises a dual inline memory module (DIMM).

4. The memory module, as set forth in claim 1, wherein each of the plurality of memory devices comprises a synchronous dynamic random access memory (SDRAM) device.

5. The memory module, as set forth in claim 2, wherein the serial presence detect device comprises a writeable serial presence detect device configured to produce an output signal, the output signal being a multi-level voltage signal.

6. The memory module, as set forth in claim 5, wherein the multi-level voltage signal is in the range of −1.1 volts−+2.1 volts.

7. The memory module, as set forth in claim 5, wherein the multi-level voltage signal comprises one of eight voltage levels.

8. The memory module, as set forth in claim 7, wherein each of the eight voltage levels is separated by a voltage gap.

9. The memory module, as set forth in claim 7, wherein each of the plurality of memory devices comprises a sensing device coupled to the single pin and configured to sense the voltage level of the multi-level voltage signal and interpreting the corresponding CAS latency of the respective memory device, correlative to the voltage level of the voltage level.

10. A system comprising:
    a processor; and
    a plurality of memory modules operably coupled to the processor and wherein each of the plurality of memory modules comprises:
    a detection device configured to produce an output signal having one of at least three voltage levels correlative to at least three respective selectable CAS latencies; and
    a plurality of memory devices coupled to the detection device, wherein each of the plurality of memory devices comprises a single pin configured to receive the output signal and configured to set the CAS latency of the respective memory device, correlative to the voltage level of the output signal.

11. The system, as set forth in claim 10, wherein the detection device comprises a serial presence detect (SPD) device.

12. The system, as set forth in claim 10, wherein each of the plurality of memory modules comprises a dual inline memory module (DIMM).

13. The system, as set forth in claim 10, wherein each of the plurality of memory devices comprises a synchronous dynamic random access memory (SDRAM) device.

14. The system, as set forth in claim 10, wherein the serial presence detect device comprises a writeable serial presence detect device configured to produce an output signal, the output signal being a multi-level voltage signal.

15. The system, as set forth in claim 14, wherein the multi-level voltage signal is in the range of −1.1 volts−+2.1 volts.

16. The system, as set forth in claim 14, wherein the multi-level voltage signal comprises one of eight voltage levels.

17. The system, as set forth in claim 16, wherein each of the eight voltage levels is separated by a voltage gap.

18. The system, as set forth in claim 16, wherein each of the plurality of memory devices comprises a sensing device coupled to the single pin and configured to sense the voltage level of the multi-level voltage signal and interpret the corresponding CAS latency of the respective memory device, correlative to the voltage level of the voltage level.

19. A method of selecting a CAS latency in a system comprising a plurality of memory modules comprising the acts of:
    sending a drive signal to a static pin on a memory device, wherein the drive signal comprises one of at least three voltage levels;
    assigning one of at least three corresponding CAS latencies, wherein the corresponding CAS latency is dependent on the voltage level of the drive signal.

20. The method, as set forth in claim 19, wherein the act of sending a drive signal comprises the act of sending the drive signal from a serial presence detect (SPD) device.

21. The method, as set forth in claim 20, comprising the act of sending a CAS latency select signal to the serial presence detect device, wherein the CAS latency select signal corresponds to the lowest CAS latency achievable by all of the memory modules in the system.

22. The method, as set forth in claim 21, comprising the act of reading a configuration device on a memory module to determine the CAS latencies that may be selected for the memory module.

23. The method, as set forth in claim 22, wherein the act of reading a configuration device comprises the act of reading the serial presence detect (SPD) device to determine the CAS latencies that may be selected for the memory module.

24. The method, as set forth in claim 23, wherein the act of reading a device comprises the act of reading the device at system boot-up.

25. The method, as set forth in claim 19, wherein the act of assigning a corresponding CAS latency, comprises the acts of:
    sensing the voltage level of the drive signal; and
    converting the drive signal into the corresponding CAS latency.

26. The method, as set forth in claim 25, comprising the act of checking a register to determine the CAS latency which corresponds to the current voltage level of the drive signal.

* * * * *